United States Patent
Chen et al.

(10) Patent No.: US 11,107,528 B2
(45) Date of Patent: *Aug. 31, 2021

(54) MULTI-STEP RESET TECHNIQUE TO ENLARGE MEMORY WINDOW

(71) Applicant: Taiwan Semiconductor Manufacturing Co., Ltd., Hsin-Chu (TW)

(72) Inventors: Chao-Yang Chen, Hsinchu (TW); Cheng-Jun Wu, Hsin-Chu (TW); Chun-Yang Tsai, Hsinchu (TW); Kuo-Ching Huang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/082,232

(22) Filed: Oct. 28, 2020

(65) Prior Publication Data

US 2021/0043257 A1    Feb. 11, 2021

Related U.S. Application Data

(63) Continuation of application No. 16/417,705, filed on May 21, 2019, now Pat. No. 10,861,547.

(51) Int. Cl.
*G11C 11/00* (2006.01)
*G11C 13/00* (2006.01)
*H01L 45/00* (2006.01)

(52) U.S. Cl.
CPC ........ *G11C 13/0097* (2013.01); *G11C 13/004* (2013.01); *G11C 13/0069* (2013.01);
(Continued)

(58) Field of Classification Search
CPC ............ G11C 13/0097; G11C 13/0069; G11C 13/004; G11C 11/00
See application file for complete search history.

(56) References Cited

U.S. PATENT DOCUMENTS 9,792,987 B1    10/2017  Chou et al.
2011/0176351 A1  7/2011  Fujitsuka et al.
(Continued)

OTHER PUBLICATIONS

Barci, Marinela. "Electrical characterization and technological optimization of Conductive Bridge RAM CBRAM devices to improve performance, speed and reliability." Micro and nanotechnologies/Microelectronics. Université Grenoble Alpes, 2016, published on Apr. 6, 2016.

(Continued)

*Primary Examiner* — Uyen Smet
(74) *Attorney, Agent, or Firm* — Eschweiler & Potashnik, LLC

(57) ABSTRACT

In some embodiments, the present disclosure relates to a method, comprising the performing of a reset operation to a resistive random access memory (RRAM) cell. A first voltage bias having a first polarity is applied to the RRAM cell. An absolute value of the first voltage bias is greater than an absolute value of a first reset voltage. The application of the first voltage bias induces the RRAM cell to change from a low resistance to an intermediate resistance greater than the low resistance. A second voltage bias having a second polarity oppose to the first polarity is then applied to the RRAM cell. An absolute value of the second reset voltage is less than an absolute value of the second voltage bias and less than the absolute value of the first reset voltage. The application of the second voltage bias induces the RRAM cell to have a high resistance.

20 Claims, 7 Drawing Sheets

(52) U.S. Cl.
CPC ............ *G11C 11/00* (2013.01); *G11C 13/003* (2013.01); *G11C 2213/79* (2013.01); *H01L 45/12* (2013.01)

(56) References Cited

U.S. PATENT DOCUMENTS

| | | |
|---|---|---|
| 2011/0310652 A1 | 12/2011 | Kim et al. |
| 2012/0211020 A1 | 8/2012 | Garcia |
| 2012/0211719 A1 | 8/2012 | Haimoto et al. |
| 2016/0211020 A1* | 7/2016 | Hsu .................. G11C 13/0007 |
| 2016/0276026 A1* | 9/2016 | Hase ................. G11C 13/0064 |
| 2017/0236581 A1 | 8/2017 | Yang et al. |

OTHER PUBLICATIONS

Berger, Michael. "Graphene flash memory." Published on Sep. 5, 2011. Retrieved online on Feb. 11, 2019 from https://www.nanowerk.com/spotlight/spotid=22630.php.

Wang et al. "Graphene resistive random memory—the promising memory device in next generation." Chinese Physics B, 2017, 26(3): 038501, published in 2017.

Math's Fun. Maxima and Minima of Functions. The date of publication is unknown. Retrieved online on Feb. 26, 2019 from https://www.mathsisfun.com/algebra/functions-maxima-minima.html.

"Mao et al., Synthesis, Properties, and Applications of Perovskite-Phase Metal Oxide Nanostructures, 2010, Material Matters, vol. 5.2" (Year: 2010).

Non-Final Office Action dated Apr. 16, 2020 for U.S. Appl. No. 16/417,705.

Notice of Allowance dated Aug. 7, 2020 for U.S. Appl. No. 16/417,705.

\* cited by examiner

US 11,107,528 B2

MULTI-STEP RESET TECHNIQUE TO ENLARGE MEMORY WINDOW

REFERENCE TO RELATED APPLICATION

This application is a Continuation of U.S. application Ser. No. 16/417,705, filed on May 21, 2019, the contents of which are hereby incorporated by reference in their entirety.

BACKGROUND

Many modern day electronic devices contain electronic memory configured to store data. Electronic memory may be volatile memory or non-volatile memory. Volatile memory stores data when it is powered, while non-volatile memory is able to store data when power is removed. Resistive random access memory (RRAM) is one promising candidate for a next generation non-volatile memory technology. RRAM has a simple structure, consumes a small cell area, has a low switching voltage and fast switching times, and is compatible with CMOS fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
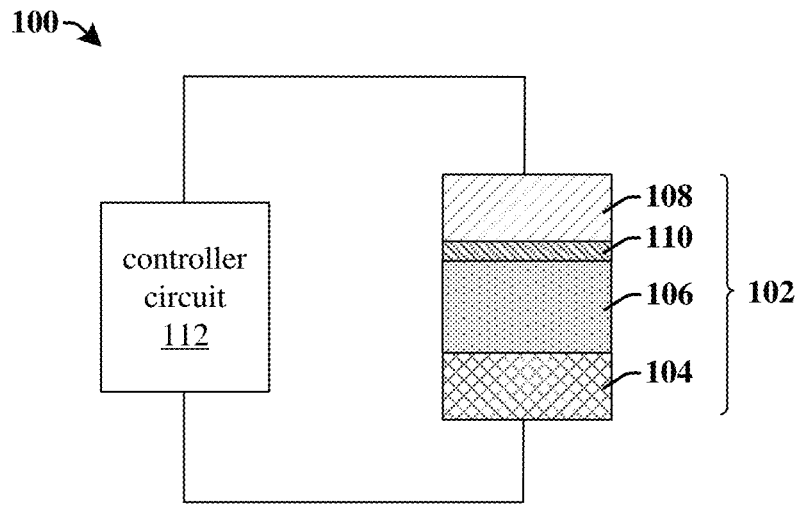
FIG. 1 illustrates a cross-sectional view of some embodiments of a resistive random access memory (RRAM) cell coupled to a controller circuit.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Resistive random access memory (RRAM) devices generally comprise a layer of high-k dielectric material arranged between conductive electrodes coupled to control circuitry. RRAM devices are configured to operate based upon a process of reversible switching between resistive states. This reversible switching is enabled by selectively forming a conductive filament through the layer of high-k dielectric material. For example, the layer of high-k dielectric material, which is normally insulating, can be made to be conductive by applying a voltage across the conductive electrodes to form a conductive filament extending through the layer of high-k dielectric material. For example, a low resistive state occurs when the conductive filament is formed, whereas a high resistive state occurs when the conductive filament is broken. An RRAM cell having a first (e.g., high) resistive state corresponds to a first data value (e.g., a logical '0'), and an RRAM cell having a second (e.g., low) resistive state corresponds to a second data value (e.g., a logical '1').

In some embodiments that are referred to as Bipolar RRAM cells, the process of reversible switching between resistive states comprises a set operation and a reset operation, which utilize voltages with opposite polarities. The set and reset operations write data to the RRAM cell. The set operation applies a set voltage having a first polarity to the RRAM cell to change the RRAM cell from a high resistive state corresponding to the first data value (e.g., a logical '0') to a low resistive state corresponding to a second data value (e.g., a logical '1'). The reset operation applies a reset voltage having a second polarity opposite to the first polarity to the RRAM cell to change the RRAM cell from the low resistive state corresponding to the second data value (e.g., a logical '1') to the high resistive state corresponding to the first data value (e.g., a logical '0').

When a read voltage is applied to the RRAM cell to perform a read operation, a read current is detected, indicating the low resistive state corresponding to the second data value (e.g., a logical '1') or the high resistive state corresponding to the first data value (e.g., a logical '0'). The memory window is the difference between a read current at the low resistive state when the read voltage is applied and a read current at the high resistive state when the read voltage is applied. In future technology nodes, the scaling of RRAM cells may be limited due to degradation in performance and reliability characteristics. For example, as the size of an RRAM cell decreases, the memory window also decreases, making it more difficult to accurately read data states from an RRAM cell.

Various embodiments of the present disclosure provide a method of performing a two-step reset operation to enlarge the memory window for an RRAM cell, thereby improving the reliability of RRAM devices. The first step of the reset operation applies a first reset voltage to an RRAM cell having a first polarity to change the RRAM cell from a low resistive state to a high resistive state. The second step of the reset operation applies a second reset voltage having a second polarity opposite to the first polarity to the RRAM cell to put the RRAM cell into an even higher resistive state. The second reset voltage has the same polarity as a set voltage of the RRAM cell and is less than the set voltage. The two-step reset operation induces the RRAM cell to have a lower read current in the high resistive state, causing the memory window of the RRAM cell to be advantageously larger, without adjusting the RRAM cell design to accommodate for a higher maximum current capability, substantially changing the reset operation programming, or substantially changing the time of the reset operation.

FIG. 1 illustrates a cross-sectional view 100 of some embodiments of an RRAM cell coupled to a controller circuit.

The cross-sectional view 100 includes an RRAM cell 102 comprising a high-k dielectric layer 106 disposed over a bottom electrode 104. In some embodiments, the RRAM cell 102 comprises a top electrode 108 disposed above the high-k dielectric layer 106. A capping layer 110, in some embodiments, is disposed between the top electrode 108 and the high-k dielectric layer 106. The bottom electrode 104 and the top electrode 108 of the RRAM cell 102 are coupled to a controller circuit 112. The controller circuit 112 is configured to apply various voltage biases across the RRAM cell 102 to change the resistive state of the high-k dielectric layer 106 by breaking or re-forming conductive filaments in the high-k dielectric layer 106. In some embodiments, the controller circuit 112 is configured to perform a two-step reset operation on the RRAM cell 102 to change the high-k dielectric layer 106 from a low resistive state to a high resistive state. The two-step reset operation maximizes the memory window of the RRAM cell to better distinguish between the high resistive state corresponding to a first data value (e.g., a logical '0') and the low resistive state corresponding to a second data value (e.g., a logical '1').

Figure 2:
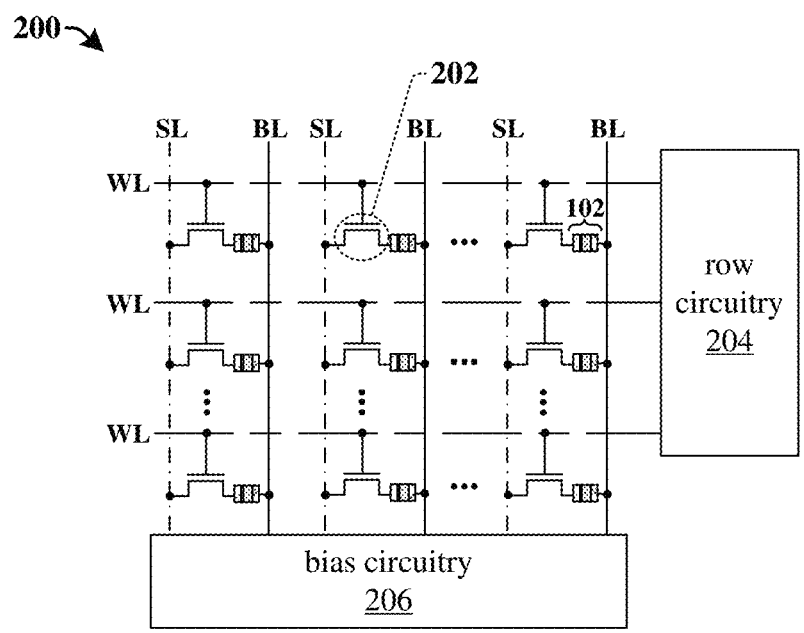
FIG. 2 illustrates a schematic of some embodiments of an RRAM array comprising bias circuitry configured to perform set and reset operations RRAM cells of the RRAM array.

FIG. 2 illustrates a schematic 200 of some embodiments of an RRAM array.

The schematic 200 includes many rows and columns of RRAM cells 102 of FIG. 1 coupled to transistors 202. Each transistor 202 has a gate that controls the power state (e.g., on/off) of the transistor 202, where the gate is controlled by a word-line WL that is coupled to row circuitry 204. Each RRAM cell 102 and corresponding transistor 202 is coupled to bias circuitry 206 via a select-line SL and a bit-line BL. The transistor 202, the row circuitry 204, and the bias circuitry 206 make up the controller circuit 112 of FIG. 1, in some embodiments.

Based on a received address, the row circuitry 204 is configured to selectively apply a current/voltage to a specific word-line WL in the RRAM array. Based on the received address and other received signals, the bias circuitry 206 is able to read or write data values to the RRAM array, one or more RRAM cells 102 at a time, by selectively applying voltage biases to a specific select-line SL and a specific bit-line BL. Thus, a specific RRAM cell 102 is selectively accessed and read or write operations are performed to the specific RRAM cell 102 when the word-line WL of the specific RRAM cell 102 is "on" and a voltage bias is present across the select-line SL and bit-line BL associated with the specific RRAM cell 102.

In some embodiments, the write operations performed by the bias circuitry 206 include a two-step reset operation and a set operation. To perform the first step in the two-step reset operation, the bias circuitry 206 is configured to apply a first voltage bias across a specific select-line SL and a specific bit-line BL of a RRAM cell 102, wherein the first voltage bias has a first polarity. To perform the second step in the two-step reset operation, the bias circuitry 206 is configured to apply a second voltage bias across the specific select-line SL and the specific bit-line BL, wherein the second voltage bias has a second polarity opposite to the first polarity. After the two-step read operation, the RRAM cell 102 is in a high-resistive state corresponding to a first data value (e.g., a logical '0'). To change RRAM cell 102 from the high resistive state to a low resistive state, the set operation may be performed. To perform the set operation, the bias circuitry 206 is configured to apply a third voltage bias across the specific select-line SL and the specific bit-line BL of the RRAM cell 102, wherein the third voltage bias has the second polarity and is greater than the second voltage bias. To perform a read operation to the RRAM cell 102, the bias circuitry 206 is configured to apply a read voltage bias across the specific select-line SL and the specific bit-line BL. To accurately read the RRAM cell 102 and to prevent switching resistive states, the read voltage bias has an absolute value that is less than absolute values of the first voltage bias, the second voltage bias and the third voltage bias.

Figure 3:
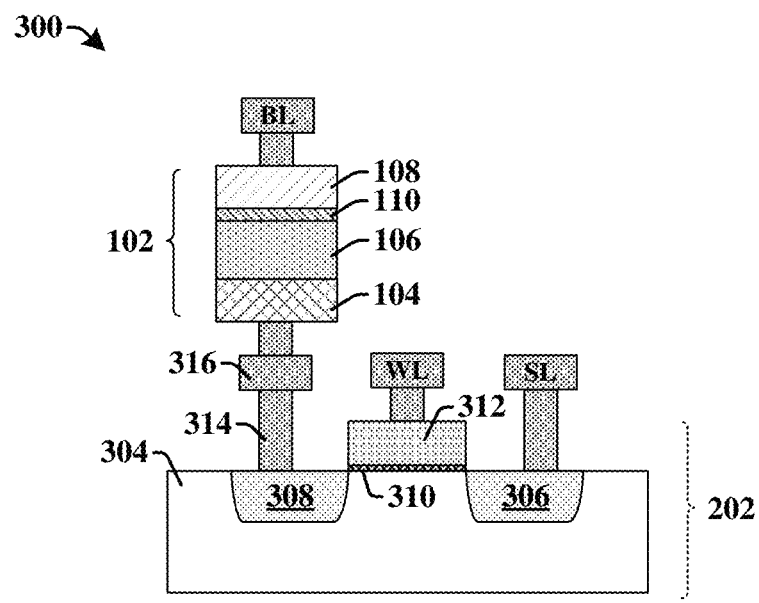
FIG. 3 illustrates some embodiments of a cross-sectional view of an integrated chip comprising an RRAM cell coupled to a transistor.

FIG. 3 illustrates a cross-sectional view 300 of an integrated chip comprising a RRAM cell coupled to a transistor.

The cross-sectional view 300 in FIG. 3 may correspond to each RRAM cell 102 coupled to each transistor 202 in the RRAM array of FIG. 2, in some embodiments. The transistor 202 comprises a source 306 and a drain 308 disposed in a substrate 304. Above the substrate 304 and between the source 306 and the drain 308 is a gate 312. A gate dielectric layer 310 may separate the gate 312 from the substrate 304. In some embodiments, the source 306 is coupled to a source-line SL. The source-line SL may be an interconnect wire 316 which is coupled to the source 306 via an interconnect via 314. In some embodiments, the gate 312 is coupled to a word-line WL. The drain 308 of the transistor 202 may be coupled to the RRAM cell 102 through the interconnect wires 316 and the interconnect vias 314. The RRAM cell 102 of FIG. 3 contains the same features as the RRAM cell 102 of FIG. 1. The RRAM cell 102 may be coupled to a bit-line BL. In some embodiments, the interconnect via 314 couples the bit-line BL to a top electrode 108 of the RRAM cell 102. In other embodiments, however, the RRAM cell 102 does not comprise a capping layer 110 or a top electrode 108. Thus, a high-k dielectric layer 106 of the RRAM cell 102 may be directly coupled to an interconnect via 314, such that the high-k dielectric layer 106 is coupled to the bit-line BL through the interconnect via 314.

Although the transistor 202 in the cross-sectional view 300 is illustrated as being a metal-oxide-semiconductor field effect transistor (MOSFET), it will be appreciated that in other embodiments, the transistor 202 may also be a bipolar junction transistor (BJT), a high electron mobility transistor (HEMT), or the like. Further, although the disclosed method and apparatus are described in relation to an RRAM cell 102, it will be appreciated that the disclosed method and apparatus are not limited to such a type of memory device.

Rather, in alternative embodiments, the disclosed method and apparatus may be applied to other types of memory devices that involve the formation of conductive filaments, such as conductive bridging random-access memory (CBRAM), carbon nanotube (CNT) memory, or the like.

In some embodiments, the bottom electrode 104 of the RRAM cell 102 may have a thickness in a range of between approximately 1 nanometer and approximately 200 nanometers. In some embodiments, the bottom electrode 104 may comprise a metal, metal-nitride, metal-oxide, or doped polysilicon. For example, in various embodiments, the bottom electrode 104 may comprise aluminum, titanium, tantalum, gold, platinum, tungsten, nickel, iridium, titanium nitride, tantalum nitride, iridium oxide, n+ polysilicon, p+ polysilicon, or the like.

In some embodiments, the high-k dielectric layer 106 comprises a single layer, whereas in other embodiments, the high-k dielectric layer 106 comprises more than one layer. In some embodiments, the high-k dielectric layer 106 of the RRAM cell 102 may have a thickness in a range of between approximately 1 nanometer and approximately 100 nanometers.
The high-k dielectric layer 106, in some embodiments, may comprise a metal-oxide, a metal-oxynitride, or a compound-metal-oxide. For example, in various embodiments, the high-k dielectric layer 106 may comprise titanium oxide, hafnium oxide, hafnium aluminum oxide, hafnium tantalum oxide, tungsten oxide, zirconium oxide, aluminum oxide, strontium oxide, or the like.

In some embodiments, the capping layer 110 of the RRAM cell 102 may have a thickness in a range of between approximately 0 nanometers and approximately 500 nanometers. In some embodiments, the capping layer 110 comprises a high oxygen affinity material (e.g., a metal or metal-oxide). For example, in various embodiments, the capping layer 110 may comprise aluminum, titanium, tantalum, titanium oxide, hafnium oxide, zirconium oxide, germanium oxide, cerium oxide, or the like.

In some embodiments, the top electrode 108 of the RRAM cell 102 may have a thickness in a range of between approximately 0 nanometers and approximately 500 nanometers.
In some embodiments, top electrode 108 comprises a metal, metal-nitride, or doped polysilicon. For example, in various embodiments, the top electrode 108 may comprise aluminum, titanium, tantalum, gold, platinum, tungsten, nickel, iridium, titanium nitride, tantalum nitride, n+ polysilicon, p+ polysilicon, or the like. In some embodiments, the top electrode 108 comprises the same material as the bottom electrode 104. In other embodiments, the top electrode 108 comprises a different material than the bottom electrode 104.

Figure 4A:
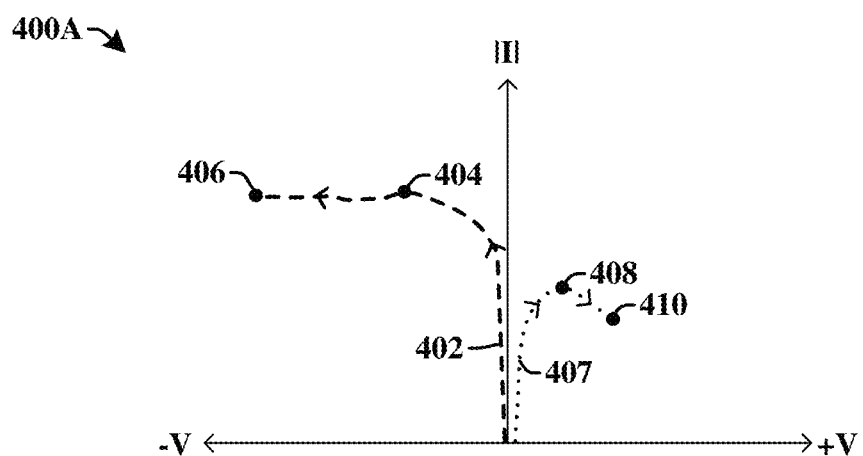
FIGS. 4A-4C illustrate some embodiments of current versus voltage plots for a two-step reset operation performed on a RRAM cell.

FIG. 4A illustrates plot 400A which shows how the current of a RRAM cell (102 of FIG. 1) changes as voltages are applied by a controller circuit (112 of FIG. 1) according to a two-step reset operation to write data on the RRAM cell (102 of FIG. 1).

A first reset operation step 402 illustrates how a first reset voltage 404 is defined in a RRAM cell (102 of FIG. 1). In the first reset operation step 402, a voltage having a first polarity (e.g., negative polarity) is applied to the RRAM cell (102 of FIG. 1), and current increases as the voltage is increased in the first polarity direction (e.g., negative). When the voltage of the first reset operation step 402 reaches the first reset voltage 404, the current begins to decrease with increasing voltage, indicating that the resistive state of the RRAM cell (102 of FIG. 1) is changing from a low resistive state to an intermediate resistive state, where the intermediate resistive state is a state of higher resistance compared to the low resistive state. In some embodiments, the first reset voltage 404 may be defined as the local maximum of the first reset operation step 402. The first reset operation step 402 has a variable end point, defined as a first reset stop voltage 406, which, in some embodiments, has an absolute value that is greater than or equal to the absolute value of the first reset voltage 404. In some embodiments, as the first reset stop voltage 406 is increased in the first polarity direction (e.g., negative), the current may further decrease, thereby further increasing the resistive state of the RRAM cell (102 of FIG. 1).

After the first reset operation step 402 is a second reset operation step 407, which is used to determine a second reset voltage 408 of the RRAM cell (102 of FIG. 1). In the second reset operation step 407, a voltage having a second polarity (e.g., positive polarity) opposite to the first polarity (e.g., negative polarity) is applied to the RRAM cell (102 of FIG. 1), and current increases as voltage is increased in the second polarity direction (e.g., positive). However, when the voltage of the second reset operation step 407 reaches the second reset voltage 408, the current begins to decrease with increasing voltage, indicating that the resistive state of the RRAM cell (102 of FIG. 1) is changing from the intermediate resistive state to a high resistive state. In some embodiments, the second reset voltage 408 may be defined as the local maximum of the second reset operation step 407. The second reset operation step 407 has a variable end point, defined as a second reset stop voltage 410, which, in some embodiments, has an absolute value that is greater than or equal to the absolute value of the first reset voltage 404. In some embodiments, as the second reset stop voltage 410 is increased in the second polarity direction (e.g., positive), the current may further decrease, thereby further increasing the resistive state of the RRAM cell (102 of FIG. 1). At the completion of the two-step reset operation, the RRAM cell (102 of FIG. 1) is in a high resistive state corresponding to the first data value (e.g., a logical '0').

Figure 4B:
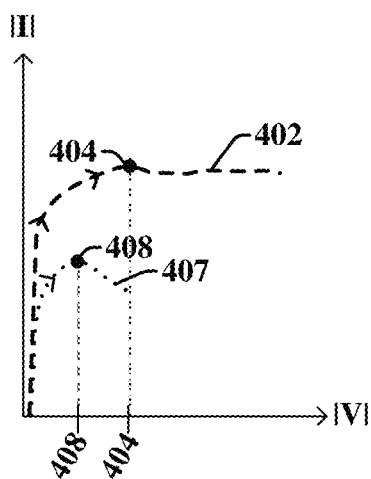

FIG. 4B illustrates an absolute value of current versus an absolute value of voltage plot 400B that includes the exemplary IV characteristic of a two-step reset operation to write data from the plot 400A of FIG. 4A, but on a same quadrant.

In some embodiments, the absolute value of the first reset voltage 404 is greater than the absolute value of the second reset voltage 408. In other embodiments, the absolute value of the first reset voltage 404 may be less than or equal to the absolute value of the second reset voltage 408. In some embodiments, the first reset operation step 402 has a higher current value that the second reset operation step 407 at a same voltage point.

Figure 4C:
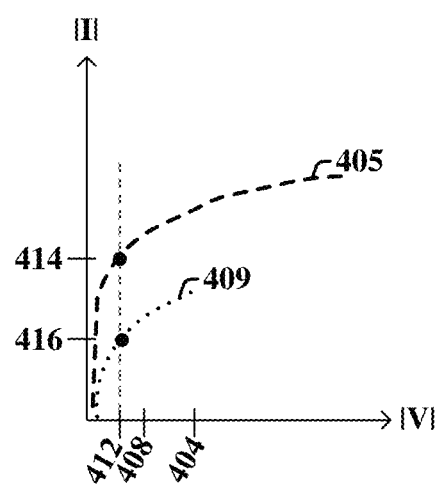

FIG. 4C illustrates plot 400C illustrating characteristics of read current versus read voltage of a read operation performed after each step of the two-step reset operation.

Plot 400C illustrates a first reset read data 405 which corresponds to the first reset operation step (402 of FIG. 4B), and a second reset read data 409, which corresponds to the second reset operation step (407 of FIG. 4B). In other words, the first reset read data 405 shows, for example, a first reset read current 414 when a read voltage 412 is applied to the RRAM cell (102 of FIG. 1) after the first reset operation step (402 of FIG. 4B) is performed. Similarly, the second reset read data 409 shows, for example, a second reset read current 416 when the read voltage 412 is applied to the RRAM cell (102 of FIG. 1) after the second reset operation step (407 of FIG. 4B) is performed. In many embodiments, the absolute value of the read voltage 412 is less than the absolute value of the first reset voltage 404 and is also less than the absolute value of the second reset voltage 408 so that the read voltage 412 does not change the resistive state of the RRAM cell (102 of FIG. 1).

In plot 400C, the first reset read data 405 is extrapolated past the second reset voltage 408 to show the intermediate resistive state of the first reset read data 405 after the first reset operation step (402 of FIG. 4B). Similarly, in plot 400C, the second read data 409 is extrapolated past the second reset voltage 408, to illustrate the high resistive state of the second reset read data 409 after the second reset operation step (407 of FIG. 4B). In other words, if the absolute value of the read voltage 412 were to exceed the absolute value of the first reset voltage 404 or the absolute value of the second reset voltage 408, the read voltage 412 would, for example, induce the first reset operation step (402 of FIG. 4B) or the second reset operation step (407 of FIG. 4B), and thus, change the read current output from what is shown in plot 400C.

In some embodiments, the read voltage 412 is in a range of between approximately 0.1 volts and a voltage that is less than the first reset voltage 404 and also the second reset voltage 408. At the read voltage 412, the second reset read current 416 is less than the first reset read current 414, indicating that the RRAM cell (102 of FIG. 1) is in a higher resistive state after the second reset operation step (407 of FIG. 4B) than after the first reset operation step (402 of FIG. 4B). In some embodiments, the second reset read current 416 is at least 10 percent less than the first reset read current 414.

Figure 5A:
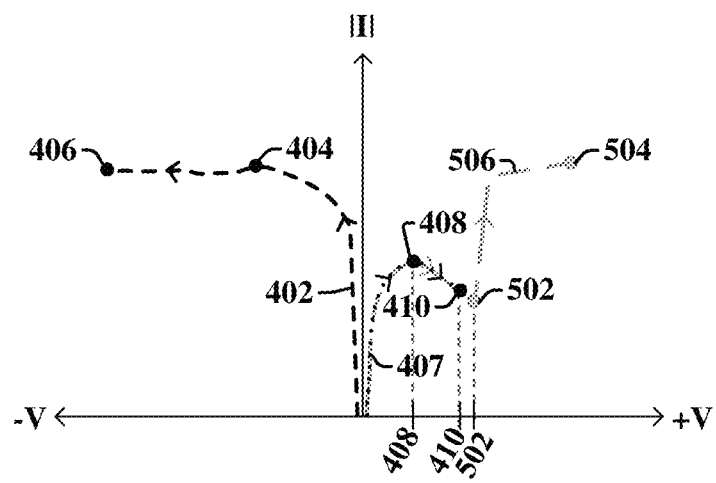
FIGS. 5A and 5B illustrate some embodiments of current versus voltage diagrams for a two-step reset operation and a set operation performed on a RRAM cell.

FIG. 5A illustrates plot 500A representative of IV characteristics of a two-step reset operation and a set operation to write data on a RRAM cell.

The plot 500A includes the first reset operation step 402 and the second reset operation step 407 of the plot 400A in FIG. 4A, and additionally includes a set operation 506. In the set operation 506, a voltage having the second polarity (e.g., positive polarity) is applied to the RRAM cell (102 of FIG. 1), and current increases and then decreases with increasing voltage. When the voltage of the set operation 506 reaches a set voltage 502, the current begins to greatly increase as voltage increases. In some embodiments, the set voltage 502 is a local minimum of current versus voltage data in the set operation 506 as voltage increases in the second polarity direction (e.g., positive). Because at the set voltage 502 the current changes from decreasing to increasing with increasing voltage, the RRAM cell (102 of FIG. 1) changes from the high resistive state to the low resistive state. The set operation 506 has a variable end defined as a set stop voltage 504, which, in some embodiments, has an absolute value that is greater than or equal to the absolute value of the set voltage 502. In some embodiments, as the set stop voltage 504 is increased in the second polarity direction (e.g., positive), the current may further increase, thereby further decreasing the resistive state of the RRAM cell (102 of FIG. 1). In some embodiments, the set stop voltage 504 is limited by the maximum current carrying capacity of the RRAM cell (102 of FIG. 1). At the completion of the set operation 506, the RRAM cell (102 of FIG. 1) is in a low resistive state corresponding to the second data value (e.g., a logical '1').

In many embodiments, the set operation 506 and the second reset operation step 407 are performed using a same voltage polarity, described previously as the second polarity (e.g., positive polarity), whereas the first reset operation step 402 uses a voltage polarity that is opposite to the second polarity, described previously as the first polarity (e.g., negative polarity). In many embodiments, the first reset voltage 404 and the set voltage 502 may be equal and opposite from one another. In other embodiments, the absolute value of the first reset voltage 404 may be greater than or less than the absolute value of the set voltage 502. In many embodiments, the second reset voltage 408 is less than the set voltage 502. Further, the second reset stop voltage 410 is less than the set voltage 502 to prevent the second reset operation step 407 from reaching the set voltage 502 and performing the set operation 506 instead of the second reset operation step 407. If the set operation 506 was performed instead of the second reset operation step 407, an incorrect data value would be written onto the RRAM cell (102 of FIG. 1); for example, the RRAM cell (102 of FIG. 1) would be in the low resistive state corresponding to the second data value (e.g., a logical '1') instead of the high resistive state corresponding to the first data value (e.g., a logical '0'). In many embodiments, the absolute value of the second reset voltage 408 is greater than 0.1 volts and less than the absolute value of the set voltage 502. In many embodiments, the second reset voltage 408 is at least 5 percent less than the set voltage 502. In many embodiments, the second reset operation step 410 overlaps a beginning portion of the set operation 506.

Figure 5B:
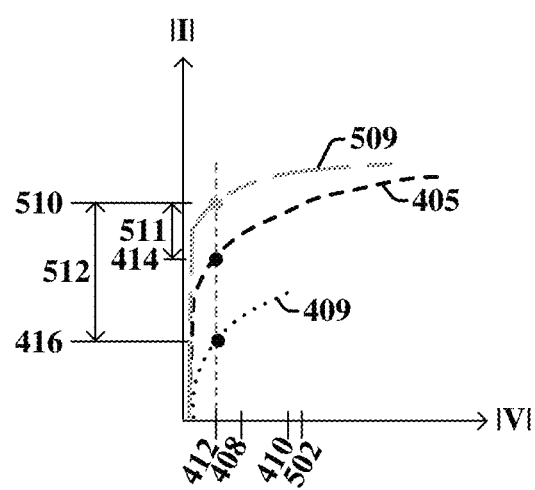

FIG. 5B illustrates plot 500B illustrating characteristics of read current versus read voltage of a read operation performed after the two-step reset operation and after the set operation.

The plot 500B includes the first reset read data 405 and the second reset read data 409 of the plot 400C in FIG. 4C, and additionally includes a set read data 509 that corresponds to the set operation (506 of FIG. 5A). The set read data 509 shows, for example, a set read current 510 when the read voltage 412 is applied to the RRAM cell (102 of FIG. 1) after the set operation (506 of FIG. 5A) is performed. The set read current 510 corresponds to a resistance that indicates a low resistive state of the RRAM cell (102 of FIG. 1), such that when a read operation is performed, the second data value (e.g., a logical '1) is read from the RRAM cell (102 of FIG. 1). Similarly, the second reset read current 416 corresponds to a resistance that indicates a high resistive state of the RRAM cell (102 of FIG. 1), such that when a read operation is performed, the first data value (e.g., a logical '0') is read from the RRAM cell (102 of FIG. 1).

In many embodiments, the absolute value of the read voltage 412 is also less than the absolute value of the set voltage 502. Additionally, the set read current 510 is greater than the second reset read current 416, indicating that the RRAM cell (102 of FIG. 1) is in a lower resistive state after the set operation (506 of FIG. 5A) than after the second reset operation step (407 of FIG. 5A). In many embodiments, the first reset read current 414 is greater than the second reset read current 416 and less than the set read current 510. Like in plot 400C, in plot 500C, the set read data 509 is extrapolated past the second reset voltage 408, to illustrate the low resistive state of the set read data 509 after the set operation (506 of FIG. 5A).

The current difference between the set read current 510 and the second reset read current 416 is defined as a memory window 512 for the RRAM cell (102 of FIG. 1) at the read voltage 412. The second reset read operation step (407 of FIG. 5A) increases the memory window 512 of the RRAM cell (102 of FIG. 1) compared to an intermediate memory window 511 that would be present if the first reset operation step (402 of FIG. 5A) were performed without the second reset operation step (407 of FIG. 5A). When the memory window 511 is large, the read operation of the RRAM cell (102 of FIG. 1) is more reliable because it is easier to distinguish between a high resistive state and a low resistive state of the RRAM cell (102 of FIG. 1), indicated by the second reset read current 416 and the set read current 510, respectively.

Figure 6A:
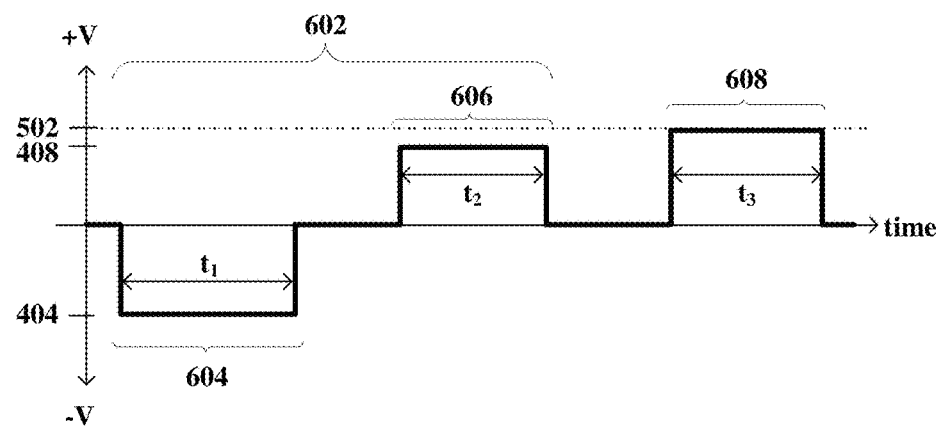
FIGS. 6A and 6B illustrate some embodiments of a timing diagram illustrating a method of performing a two-step reset operation and a set operation on a RRAM cell.

FIG. 6A illustrates a timing diagram 600A of some embodiments a method of performing a two-step reset operation and a set operation. The timing diagram 600A represents voltage bias applied over time to the RRAM cell (102 of FIG. 1) by the controller circuit (112 of FIG. 1).

To write a first data value (e.g., a logical '0') to the RRAM cell (102 of FIG. 1) associated with the high resistive state, a two-step reset operation method 602 is performed, comprising a first reset pulse step 604 associated with the first reset operation step (402 of FIG. 4A) and a second reset pulse step 606 associated with the second reset operation step (407 of FIG. 4A). In some embodiments, the first reset pulse step 604 comprises a single voltage pulse having the first polarity (e.g., negative polarity) that is applied to the RRAM cell (102 of FIG. 1) for a first time duration $t_1$. The single voltage pulse of the first reset pulse step 604 has an amplitude that is greater than or equal to the first reset voltage 404 of the RRAM cell (102 of FIG. 1) to ensure that the intermediate resistive state is reached associated with the first reset operation step (402 of FIG. 4A). For example, in some embodiments, the amplitude of the first reset pulse step 604 may correspond to the first reset stop voltage (406 of FIG. 4A). In some embodiments, the second reset pulse step 606 comprises applying a single voltage pulse having the second polarity (e.g., positive polarity) opposite to the first polarity (e.g., negative polarity) to the RRAM cell (102 of FIG. 1) for a second time duration $t_2$. The single voltage pulse of the second reset pulse step 606 has an amplitude that is greater than or equal to the second reset voltage 408 of the RRAM cell (102 of FIG. 1) to ensure that the high resistive state is reached associated with the second reset operation step (407 of FIG. 4A). For example, in some embodiments, the amplitude of the second reset pulse step 606 may correspond to the second reset stop voltage (410 of FIG. 4A). As described previously, the second reset stop voltage (410 of FIG. 4A) is less than the set voltage 502, and thus, the amplitude of the second reset pulse step 606 must be greater than or equal to the second reset voltage 408 but less than the set voltage 502. At the completion of the two-step reset operation method 602, the RRAM cell (102 of FIG. 1) is in the high resistive state associated with the first data value (e.g., a logical '0').

To write a second data value (e.g., a logical '1') to the RRAM cell (102 of FIG. 1) associated with the low resistive state, a set operation method 608 is performed that is associated with the set operation (506 of FIG. 5A). In some embodiments, the set operation method 608 comprises a single voltage pulse having the second polarity (e.g., positive polarity) that is applied to the RRAM cell (102 of FIG. 1) for a third time duration $t_3$. The single voltage pulse of the set operation method 608 has an amplitude that is greater than or equal to the set voltage 502 of the RRAM cell (102 of FIG. 1) to ensure that the low resistive state is reached associated with the set operation (506 of FIG. 5A). For example, in some embodiments, the amplitude of the set operation method 608 may correspond to the set stop voltage (504 of FIG. 5A). At the completion of the set operation method 608, the RRAM cell (102 of FIG. 1) is in the high resistive state associated with the second data value (e.g., a logical '1').

Compared to other methods that use a one-step reset operation that consists of a single voltage pulse having a first polarity (e.g., negative polarity), the two-step reset operation method 602 is advantageous because the second reset pulse step 606 further increases the resistive state of the RRAM cell (102 of FIG. 1), thereby increasing the memory window (512 of FIG. 5B) of the RRAM cell (102 of FIG. 1) to more reliably store data in a RRAM device.

It will be appreciated that the timing diagram 600A is an exemplary embodiment, and in other embodiments, the timing diagram 600A may include only the two-step reset operation method 602 or only the set operation method 608, depending on the desired data to be written to the RRAM cell (102 of FIG. 1).

Figure 6B:
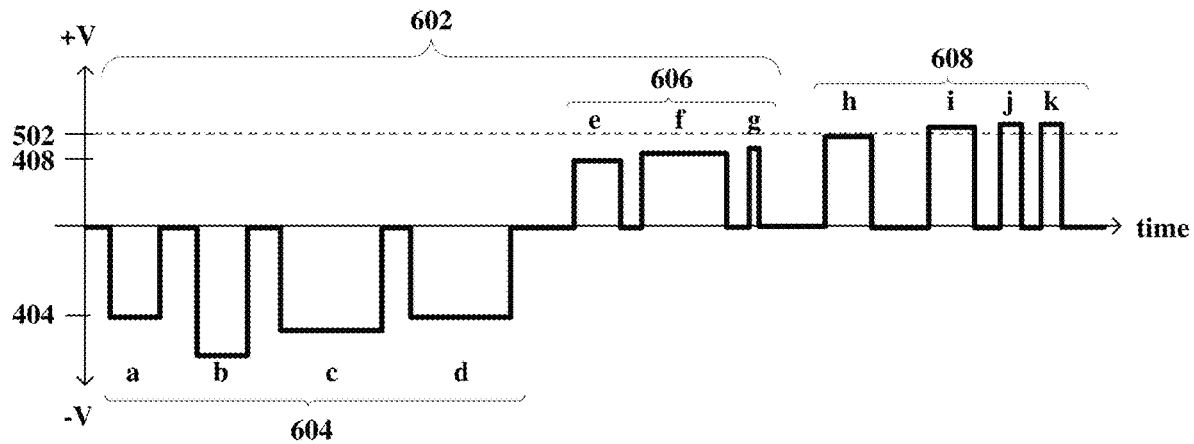

FIG. 6B illustrates a timing diagram 600B of some embodiments of a method of performing a two-step reset operation and a set operation using multiple voltage pulses. The timing diagram 600B represents voltage bias applied over time to the RRAM cell (102 of FIG. 1) by the controller circuit (112 of FIG. 1), for example.

The timing diagram 600B includes the two-step reset operation method 602 and the set operation method 608 of FIG. 6A, except that multiple voltage pulses are applied to the RRAM cell (102 of FIG. 1) for each step to advantageously ensure that the desired resistive state is achieved. For example, in some embodiments, the first reset pulse step 604 of the two-step reset operation method 602 may include pulses a-d. The pulses a-d may have varying, equal, or some varying and some equal amplitudes compared to one another. Each pulse a-d of the first reset pulse step 604 has the first polarity, and the amplitude of each pulse a-d is still greater than or equal to the first reset voltage 404. Similarly, the pulses a-d may have varying, equal, or some varying and some equal time durations compared to one another. The number of pulses a-d and corresponding amplitudes and time durations in the first reset pulse step 604 is dependent upon achieving the intermediate resistive state associated with the first reset operation step (402 of FIG. 4A).

In some embodiments, the second reset pulse step 606 of the two-step reset operation method 602 may include pulses e-g. The pulses e-g may have varying, equal, or some varying and some equal amplitudes compared to one another. Each pulse e-g of the second reset pulse step 606 has the second polarity, and the amplitude of each pulse e-g is still greater than or equal to the second reset voltage 408 but less than the set voltage 502. Similarly, the pulses e-g may have varying, equal, or some varying and some equal time durations compared to one another. The number of pulses e-g and corresponding amplitudes and time durations in the second reset pulse step 606 is dependent upon achieving the high resistive state associated with the second reset operation step (407 of FIG. 4A).

In some embodiments, the set operation method 608 may include pulses h-k. The pulses h-k may have varying, equal, or some varying and some equal amplitudes compared to one another. Each pulse h-k of the set operation method 608 has the second polarity, and the amplitude of each pulse h-k is still greater than or equal to the set voltage 502. Similarly, the pulses h-k may have varying, equal, or some varying and some equal time durations compared to one another. The number of pulses h-k and corresponding amplitudes and time durations in the set operation method 608 is dependent upon achieving the low resistive state associated with the set operation (506 of FIG. 5A). In some embodiments, the time durations of each pulse a-k may, for example, be in a range of between approximately 1 nanosecond and approximately 100 microseconds. In some embodiments, the absolute values of the amplitudes of each pulse 1-*k* may, for example, be in a range of between approximately 0.2 volts and approximately 5 volts.

Figure 7:
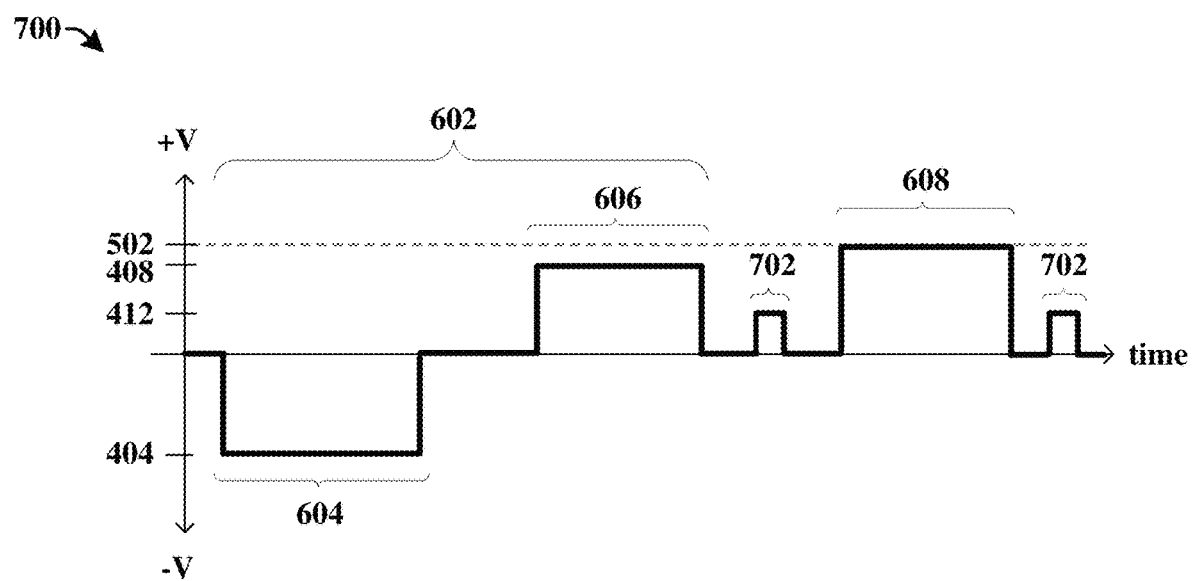
FIG. 7 illustrates some embodiments of a timing diagram illustrating a method of performing read operations between a two-step reset operation and a set operation on a RRAM cell.

FIG. 7 illustrates a timing diagram 700 of some embodiments a method of performing a two-step reset operation, a set operation, and read operations.

The timing diagram 700 includes the two-step reset operation method 602 and the set operation method 608 of the timing diagram 600A of FIG. 6A, with the addition of read operations 702. To perform the read operation 702 to read a data value (e.g., a logical '1' or a logical '0') of the RRAM cell (102 of FIG. 1), the read voltage 412 is applied to the RRAM cell (102 of FIG. 1) by the controller circuit (112 of FIG. 1). The read operation 702, in many embodiments, comprises a single voltage pulse having an amplitude equal to the read voltage 412. The absolute value of the read voltage 412 is less than absolute values of the first reset voltage 404, the second reset voltage 408, and the set voltage 502.

In some embodiments, a read operation 702 may be performed after the two-step reset operation method 602, where the read voltage 412 is applied to the RRAM cell (102 of FIG. 1) and the second reset read current (416 of FIG. 5B) is measured. The second reset read current (416 of FIG. 5B) indicates that after the two-step reset operation method 602, the RRAM cell (102 of FIG. 1) is in the high resistive state, corresponding to the first data value (e.g., a logical '0').

In some embodiments, a read operation 702 may be performed after the set operation method 608, where the read voltage 412 is applied to the RRAM cell (102 of FIG. 1) and the set read current (510 of FIG. 5B) is measured. The set read current (510 of FIG. 5B) indicates that after the set operation method 608, the RRAM cell (102 of FIG. 1) is in the low resistive state, corresponding to the second data value (e.g., a logical '1'). The low resistive state and the high resistive state of the RRAM cell (102 of FIG. 1) are detectable from one another because of the increase in the memory window (512 of FIG. 5B) between the second reset read current (416 of FIG. 5B) indicating the high resistive state and the set read current (510 of FIG. 5B) indicating the low resistive state.

Figure 8:
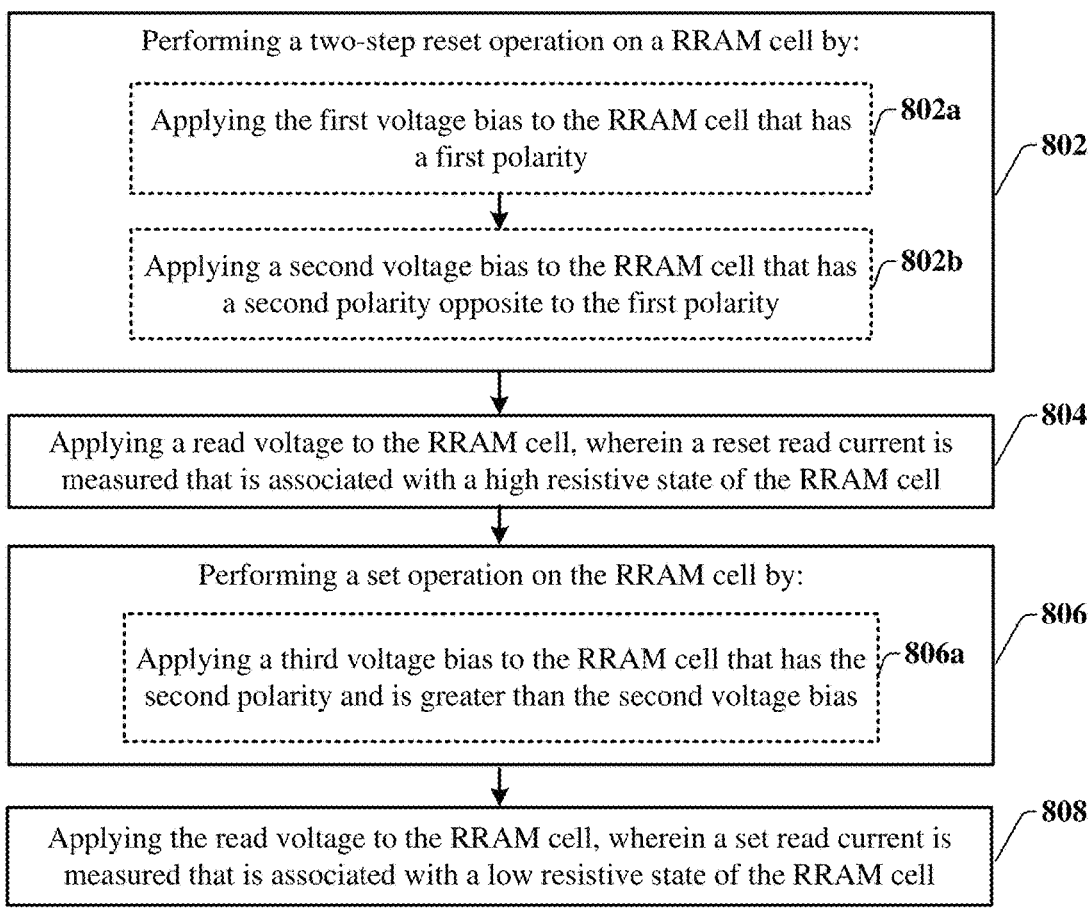
FIG. 8 illustrates a flow diagram of some embodiments of a method of performing a two-step reset operation on a RRAM cell.

FIG. 8 illustrates a flow diagram of some embodiments of a method 800 of performing a two-step reset operation.

While method 800 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 802, a two-step reset operation is performed on a RRAM cell by acts 802a and 802b.

At 802a, a first voltage bias is applied to the RRAM cell that has a first polarity.

At 802b, a second voltage bias is applied to the RRAM cell that has a second polarity opposite to the first polarity. FIG. 6A illustrates a timing diagram 600A of some embodiments corresponding to acts 802, 802a, and 802b.

At 804, a read voltage is applied to the RRAM cell, and a reset read current is measured that is associated with a high resistive state of the RRAM cell. FIG. 4C and FIG. 7 illustrate a plot 400C and a timing diagram 700, respectively, of some embodiments corresponding to act 804.

At 806, a set operation is performed on the RRAM cell by act 806a.

At 806a, a third voltage bias is applied to the RRAM cell that has the second polarity and is greater than the second voltage bias. FIG. 6A illustrates a timing diagram 600A of some embodiments corresponding to acts 806 and 806a.

At 808, the read voltage to the RRAM cell is applied, and a set read current is measured that is associated with a low resistive state of the RRAM cell. FIG. 5B and FIG. 7 illustrate a plot 500B and a timing diagram 700, respectively, of some embodiments corresponding to act 808.

Therefore, the present disclosure relates to a new method of performing a two-step reset operation to a RRAM cell in order to decrease a reset read current, thereby increasing the memory window of the RRAM cell. With an increased memory window, the RRAM cell can more reliably read data values associated with resistive states of the RRAM cell.

Accordingly, in some embodiments, the present disclosure relates to a method of operating a resistive random access memory (RRAM) cell, comprising: performing a reset operation to the RRAM cell, by: applying a first voltage bias to a RRAM cell, wherein the first voltage bias has a first polarity, wherein the application of the first voltage bias induces the RRAM cell to change from a low resistance to an intermediate resistance, and wherein the intermediate resistance is greater than the low resistance; and applying a second voltage bias to the RRAM cell, wherein the second voltage bias has a second polarity, wherein the second polarity is opposite to the first polarity, and wherein the application of the second voltage bias induces the RRAM cell to have a high resistance, wherein the high resistance is greater than the intermediate resistance.

In other embodiments, the present disclosure relates to a method of operating a resistive random access memory (RRAM) cell, comprising: applying a read voltage to the RRAM cell to determine a first resistance at the read voltage, wherein the read voltage has a first polarity; performing a first step in a reset operation by applying a first write voltage to the RRAM cell, wherein the first write voltage has a second polarity opposite to the first polarity, wherein an absolute value of the first write voltage is greater than an absolute value of the read voltage; performing a second step in the reset operation by applying a second write voltage to the RRAM cell, wherein the second write voltage has the first polarity, wherein an absolute value of the second write voltage is greater than the absolute value of the read voltage; and applying the read voltage to the RRAM cell to determine a second resistance at the read voltage, wherein the second resistance is greater than the first resistance.

In yet other embodiments, the present disclosure relates to a random access memory (RAM) cell, comprising: a high-k dielectric layer disposed over a bottom electrode, wherein the high-k dielectric layer is configured to change between a high resistive state and a low resistive state; a controller circuit coupled to the RAM cell, wherein the controller circuit is configured to perform a reset operation by applying a first voltage bias having a first polarity followed by a second voltage bias having a second polarity opposite to the first polarity such that the high-k dielectric layer is in a high resistive state, and wherein the controller circuit is configured to perform a set operation by applying a third voltage bias having the second polarity, wherein the third voltage bias is greater than the second voltage bias, such that the high-k dielectric layer is in a low resistive state relative to the high resistive state.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of operating a resistive random access memory (RRAM) cell, comprising:
    performing a reset operation to the RRAM cell, by:
    applying a first voltage bias to the RRAM cell, wherein the first voltage bias has a first polarity, wherein an absolute value of the first voltage bias is greater than an absolute value of a first reset voltage, wherein the application of the first voltage bias induces the RRAM cell to change from a low resistance to an intermediate resistance, and wherein the intermediate resistance is greater than the low resistance; and
    applying a second voltage bias to the RRAM cell, wherein the second voltage bias has a second polarity, wherein the second polarity is opposite to the first polarity, wherein an absolute value of the second voltage bias is greater than an absolute value of a second reset voltage, wherein the absolute value of the second reset voltage is less than the absolute value of the first reset voltage, wherein the application of the second voltage bias induces the RRAM cell to have a high resistance, and wherein the high resistance is greater than the intermediate resistance.

2. The method of claim 1, wherein each of the low resistance, the intermediate resistance and the high resistance are measured at a read voltage, and wherein an absolute value of the read voltage is less than the absolute values of the first and second voltage biases.

3. The method of claim 1, wherein the first reset voltage is a local maximum of current versus voltage behavior of the RRAM cell as the first voltage bias is applied to the RRAM cell.

4. The method of claim 1, wherein the second reset voltage is a local maximum of current versus voltage behavior of the RRAM cell as the second voltage bias is applied to the RRAM cell.

5. The method of claim 1, further comprising:
    performing a set operation to the RRAM cell, by:
    applying a third voltage bias to the RRAM cell, wherein the third voltage bias has the second polarity, wherein an absolute value of the third voltage bias is greater than the absolute value of the second voltage bias, and wherein the application of the third voltage bias induces the RRAM cell to change from the high resistance to the low resistance.

6. The method of claim 5, wherein the intermediate resistance has a corresponding first read current measured at a read voltage, wherein the low resistance has a corresponding second read current measured at the read voltage, and wherein the second read current is greater than the first read current.

7. The method of claim 5, wherein the absolute value of the third voltage bias is greater than the absolute value of the first voltage bias.

8. The method of claim 5, wherein the third voltage bias is greater than an absolute value of a set voltage, and wherein the set voltage is a local minimum of current versus voltage behavior of the RRAM cell as the third voltage bias is applied to the RRAM cell.

9. The method of claim 1, wherein the first voltage bias comprises a first pulse and a second pulse, wherein the first pulse includes a first pulse voltage held for a first time duration, wherein the second pulse includes a second pulse voltage held for a second time duration, wherein the first pulse voltage is different than the second pulse voltage, and wherein an absolute value of the first pulse voltage and an absolute value of the second pulse voltage are greater than the absolute value of the first reset voltage.

10. The method of claim 1, wherein the second voltage bias comprises a first pulse and a second pulse, wherein the first pulse includes a first pulse voltage held for a first time duration, wherein the second pulse includes a second pulse voltage held for a second time duration, wherein the first pulse voltage is different than the second pulse voltage, and wherein an absolute value of the first pulse voltage and an absolute value of the second pulse voltage are greater than the absolute value of the second reset voltage.

11. A method of operating a resistive random access memory (RRAM) cell, comprising:
    performing a first step in a reset operation by applying a first write voltage to the RRAM cell, wherein the first write voltage has a first polarity;
    applying a read voltage to the RRAM cell to determine a first resistance at the read voltage, wherein the read voltage has a second polarity opposite to the first polarity, and wherein an absolute value of the read voltage is less than an absolute value of the first write voltage;
    performing a second step in the reset operation by applying a second write voltage to the RRAM cell, wherein the second write voltage has the second polarity, and wherein an absolute value of the second write voltage is greater than the absolute value of the read voltage;
    applying the read voltage to the RRAM cell to determine a second resistance at the read voltage, wherein the second resistance is greater than the first resistance;
    performing a set operation to the RRAM cell by applying a third write voltage to the RRAM cell, wherein the third write voltage has the second polarity, wherein an absolute value of the third write voltage is greater than the absolute value of the second write voltage; and
    applying the read voltage to the RRAM cell to determine a third resistance at the read voltage, wherein the third resistance is less than the first resistance and is less than the second resistance.

12. The method of claim 11, wherein the first step in the reset operation further comprises applying multiple write voltages in pulses to the RRAM cell, wherein each write voltage of the multiple write voltages has an amplitude and a pulse width, wherein the pulse width is a duration of time that each write voltage is applied to the RRAM cell, wherein an absolute value of each write voltage is greater than or equal to the absolute value of the first write voltage, and wherein a first one of the amplitudes of a first one of the multiple write voltages differs from at least a second one of the amplitudes of a second one of the multiple write voltages.

13. The method of claim 11, wherein the second step in the reset operation further comprises applying multiple write voltages in pulses to the RRAM cell, wherein each write voltage of the multiple write voltages has an amplitude and a pulse width, wherein the pulse width is a duration of time that each write voltage is applied to the RRAM cell, wherein an absolute value of each write voltage is greater than or equal to the absolute value of the second write voltage, and wherein a first one of the amplitudes of a first one of the multiple write voltages differs from at least a second one of the amplitudes of a second one of the multiple write voltages.

14. The method of claim 11, wherein the absolute value of the first write voltage is greater than the absolute value of the second write voltage.

15. The method of claim 11, wherein the absolute value of the third write voltage is greater than the absolute value of the first write voltage.

16. A random access memory (RAM) cell, comprising:
a high-k dielectric layer disposed over a bottom electrode, wherein the high-k dielectric layer is configured to change between a high resistive state and a low resistive state; and
a controller circuit coupled to the RAM cell, wherein the controller circuit is configured to perform a reset operation by applying a first voltage bias having a first polarity followed by a second voltage bias having a second polarity opposite to the first polarity such that the high-k dielectric layer is in a high resistive state, wherein an absolute value of the first voltage bias is greater than an absolute value of a first reset voltage, wherein an absolute value of the second voltage bias is greater than an absolute value of a second reset voltage, and wherein the absolute value of the second reset voltage is less than or equal to the absolute value of the first reset voltage.

17. The RAM cell of claim 16, wherein the controller circuit comprises a transistor, wherein the high-k dielectric layer is arranged between a top electrode and the bottom electrode, wherein the top electrode is coupled to a bit-line, wherein the bottom electrode is coupled to a drain of the transistor, wherein a source region of the transistor is coupled to a source-line, and wherein a gate of the transistor is coupled to a word-line.

18. The RAM cell of claim 16, wherein the controller circuit is configured to perform a read operation by applying a read voltage to the RAM cell to determine a resistive state of the high-k dielectric layer, wherein an absolute value of the read voltage is less than the absolute value of the first voltage bias and the absolute value of the second voltage bias.

19. The RAM cell of claim 16, wherein the controller circuit is configured to perform a set operation by applying a third voltage bias having the second polarity, wherein an absolute value of the third voltage bias is greater than the absolute value of the second reset voltage and is greater than the absolute value of the second voltage bias.

20. The RAM cell of claim 19, wherein the absolute value of the third voltage bias is less than or equal to the absolute value of the first voltage bias.

* * * * *